(12) United States Patent
Lu et al.

(10) Patent No.: US 10,943,652 B2
(45) Date of Patent: Mar. 9, 2021

(54) MEMORY PROCESSING UNIT

(71) Applicant: The Regents of The University of Michigan, Ann Arbor, MI (US)

(72) Inventors: Wei Lu, Ann Arbor, MI (US); Mohammed A. Zidan, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 21 days.

(21) Appl. No.: 15/986,347

(22) Filed: May 22, 2018

(65) Prior Publication Data
US 2019/0362787 A1    Nov. 28, 2019

(51) Int. Cl.
| G11C 13/00 | (2006.01) |
| G11C 11/56 | (2006.01) |
| G06F 7/544 | (2006.01) |
| G06F 17/16 | (2006.01) |

(52) U.S. Cl.
CPC ........ *G11C 13/0028* (2013.01); *G06F 7/5443* (2013.01); *G06F 17/16* (2013.01); *G11C 11/56* (2013.01)

(58) Field of Classification Search
CPC ... G11C 13/0028; G11C 11/56; G06F 7/5443; G06F 17/16
USPC .......................................................... 365/148
See application file for complete search history.

(56) References Cited

U.S. PATENT DOCUMENTS

| 5,559,970 A  | 9/1996 | Sharma |
| 6,759,869 B1 | 7/2004 | Young et al. |
| 7,554,355 B2 | 6/2009 | Chang et al. |
| 7,564,262 B2 | 7/2009 | Mouttet |

(Continued)

FOREIGN PATENT DOCUMENTS

| CN | 107533668 | 1/2018 |
| EP | 1443417 A1 | 8/2004 |

(Continued)

OTHER PUBLICATIONS

M. Hu et al "Memristor Crossbar Neuromorphic Computing System: A Case Study", IEEE Transactions on Neural Networks and Lewarning Systems 25, 10 (2014).

(Continued)

*Primary Examiner* — Sung Il Cho

(57) ABSTRACT

An in-memory computing system for computing vector-matrix multiplications includes an array of resistive memory devices arranged in columns and rows, such that resistive memory devices in each row of the array are interconnected by a respective wordline and resistive memory devices in each column of the array are interconnected by a respective bitline. The in-memory computing system also includes an interface circuit electrically coupled to each bitline of the array of resistive memory devices and computes the vector-matrix multiplication between an input vector applied to a given set of wordlines and data values stored in the array. For each bitline, the interface circuit receives an output in response to the input being applied to the given wordline, compares the output to a threshold, and increments a count maintained for each bitline when the output exceeds the threshold. The count for a given bitline represents a dot-product.

20 Claims, 6 Drawing Sheets

(56) References Cited

U.S. PATENT DOCUMENTS

| | | | |
|---|---|---|---|
| 7,609,086 B2* | 10/2009 | Mouttet | G11C 13/0009 326/38 |
| 8,082,526 B2 | 12/2011 | Hutton et al. | |
| 9,026,719 B2 | 5/2015 | Hyde et al. | |
| 9,442,854 B2 | 9/2016 | Hyde et al. | |
| 9,627,052 B1* | 4/2017 | Pellizzer | G11C 13/0023 |
| 9,852,790 B1 | 12/2017 | Gokmen et al. | |
| 10,073,733 B1 | 9/2018 | Jain et al. | |
| 10,171,084 B2 | 1/2019 | Lu et al. | |
| 2007/0126474 A1 | 6/2007 | Chang et al. | |
| 2008/0309539 A1* | 12/2008 | Baker | G11C 16/26 341/155 |
| 2008/0310244 A1* | 12/2008 | Baker | G11C 7/1051 365/207 |
| 2010/0054072 A1 | 3/2010 | Stansfield | |
| 2010/0085826 A1* | 4/2010 | Kang | G11C 29/50 365/201 |
| 2012/0254541 A1 | 10/2012 | Beckmann et al. | |
| 2013/0064000 A1* | 3/2013 | Hamada | G11C 11/5685 365/148 |
| 2014/0172937 A1 | 6/2014 | Linderman et al. | |
| 2015/0003167 A1* | 1/2015 | Choi | G11C 16/10 365/185.19 |
| 2015/0029796 A1* | 1/2015 | Choi | G11C 16/0483 365/189.05 |
| 2015/0294217 A1 | 10/2015 | Aparicio, IV | |
| 2016/0049195 A1 | 2/2016 | Yu et al. | |
| 2016/0062692 A1* | 3/2016 | Finkbeiner | G11C 7/1009 711/154 |
| 2016/0336064 A1 | 11/2016 | Seo et al. | |
| 2017/0011290 A1* | 1/2017 | Taha | G06N 3/0635 |
| 2017/0256296 A1 | 9/2017 | Wang | |
| 2017/0346800 A1* | 11/2017 | Katoh | G06F 21/73 |
| 2018/0067720 A1 | 3/2018 | Bekas et al. | |
| 2018/0095930 A1* | 4/2018 | Lu | H03K 19/177 |
| 2018/0114569 A1* | 4/2018 | Strachan | G11C 7/1006 |
| 2018/0197917 A1 | 7/2018 | Ando et al. | |
| 2018/0315473 A1* | 11/2018 | Yu | G11C 11/412 |
| 2018/0322094 A1 | 11/2018 | Friedman et al. | |
| 2019/0034201 A1* | 1/2019 | Muralimanohar | H03M 3/50 |
| 2019/0066780 A1* | 2/2019 | Hu | G11C 11/56 |
| 2020/0020393 A1* | 1/2020 | Al-Shamma | G11C 16/08 |

FOREIGN PATENT DOCUMENTS

| | | |
|---|---|---|
| EP | 03425054 A1 | 1/2019 |
| TW | 201432678 | 8/2014 |

OTHER PUBLICATIONS

Sharad, et al "Ultra Low Power Associative Computing With Spin Neurons and Resistive Crossbar Memory" Proceedings of the 50th Annual Design Automation Conference. ACM (2013).

B. Chen et al "Efficient In-Memory Computing Architecture Based on Crossbar Arrays", IEEE (2015).

S. H. Jo et al "Nano-scale Memristor Device As Synapse in Neuromorphic Systems" Nano Left 10, (2010).

K. Kim "A Functional Memristor Crossbar-Array/CMOS System for Data Storage and Neuromorphic Applications", Nano Lett. (2012).

* cited by examiner

MEMORY PROCESSING UNIT

GOVERNMENT FUNDING

This invention was made with government support under Grant No. CCF-1617315 awarded by the National Science Foundation. The Government has certain rights in this invention.

FIELD

The present disclosure relates to performing computations with an array of resistive memory devices.

BACKGROUND

This section provides background information related to the present disclosure which is not necessarily prior art.

Historically computing advances were mainly driven by CMOS transistor scaling following Moore's law, where new generations of devices are smaller, faster, and cheaper, leading to more powerful circuits and systems. However, conventional scaling is facing significant technical challenges and fundamental limits. Moreover, classical computing architectures were not originally designed to handle modern applications, such as cognitive processing, artificial intelligence, big-data analysis, and edge computing. Recently, new devices, circuits, and architectures are being pursued to meet present and future computing needs, where tight integration of memory and logic and parallel processing are highly desired. To this end, emerging resistive memory technologies, such as RRAM, STT-MRAM, and PCRAM, have attracted broad interest as promising candidates for future memory and computing applications. Besides tremendous appeal in data storage applications, resistive devices offer the potential to enable efficient in-memory computing architectures that differ from conventional computing systems.

For a typical memory/storage application, resistive memory (RM) devices store the data in the form of electrical resistance, for example, ZERO is represented by high resistance state (HRS), and ONE is represented by low resistance state (LRS). In the present application, RM devices refer to resistive random-access memory (RRAM), magnetic random-access memory (MRAM) and phase-change random-access memory (PCRAM), or other memory technologies that rely on resistance change to store data. These devices can be formed in a crossbar structure that offers high storage density and random-access capability. Programming an RM device between the LRS and HRS states is typically achieved through a voltage or current bias with the amplitude above certain threshold values. Reading the device state is typically achieved with a lower voltage bias below a threshold value. Due to their resistive nature, the RM devices can act as a two-terminal switch that directly modulates the current passing through it based on the resistance values. Therefore, the current passes through the devices is equal to the applied voltage multiplied by the stored conductance value, without having to retrieve data from a separate memory and processing the multiplication in a separate processor. This property in principle allows RM systems to directly perform vector-matrix multiplications (including vector-vector dot-product operations) in-memory, where multiply-accumulate (MAC) operations can be processed in parallel. The co-location of memory and logic, and the high parallelism that can be offered by the crossbar structure, have generated interest in RM-based computing systems.

The focus has been on tasks such as artificial neural networks, which typically aim to obtain an approximate or qualitative solution, although more general matrix-based tasks can also be implemented. However, a practical realization of these system is difficult due to limitations of these emerging RM technologies, including limited precision, large device variabilities, and limited ON/OFF ratio. In addition, sampling the results of the analog operations requires bulky interface circuitry based on analog-to-digital converters (ADCs), which significantly affects the performance of the complete system.

SUMMARY

This section provides a general summary of the disclosure, and is not a comprehensive disclosure of its full scope or all of its features.

An in-memory computing system includes an array of resistive memory (RM) devices and an interface circuit, for performing multiply-accumulate (MAC) operations and computing vector-matrix multiplications. The array of RM devices is arranged in columns and rows, such that RM devices in each row of the array are interconnected by a respective wordline and RM devices in each column of the array are interconnected by a respective bitline. Each RM device in the array of RM devices has an associated threshold voltage and is configured to store a data value as a resistance value. The interface circuit electrically coupled to each bitline of the array of RM devices and cooperatively operates with the array of RM devices to compute a vector-matrix multiplication between an input vector applied to the wordlines and data values stored in the array of RM devices. For each bitline, the interface circuit receives an output in response to an input being applied to a given wordline, compares the output to a threshold, and increments a count maintained for each bitline when the output exceeds the threshold. The count represents the digitized multiply-accumulate (MAC) operation performed between the input at the given wordline and the conductance of the RM device interconnected by the given bitline and the given wordline. The cumulative count for a given bitline after all relevant wordlines are processed represents the digitized dot-product of the input vector and the stored vector represented by values of RM devices along the given bitline.

In various implementations, the input applied to the given wordline is a voltage applied to the given wordline as a pulse, and the output of each bitline, before reaching the interface circuit, is a current value. Further, the input may be a series of pulses, and a total of the series of pulses represents the input value. The input may be applied to each wordline sequentially.

In another aspect, a decoder is electrically coupled to each wordline. The decoder is configured to apply the input to each wordline. The interface circuit can include a plurality of comparators, where each comparator of the plurality of comparators is electrically coupled to a corresponding bitline and a respective comparator receives the output from the corresponding bitline and compares the output to a threshold associated with the respective comparator.

In another aspect, the interface circuit includes a plurality of counters, where each counter of the plurality of counters is electrically coupled to a corresponding comparator and, in response to the output exceeding the threshold associated with the respective comparator, incrementing a count of a respective counter.

In various implementations, each device in the array of RM devices stores at least one of a resistance value and a conductance value, and at least one of the resistance value and the conductance value is an element of a potential feature (or weight, or coefficient) vector represented in a column of the array of RM devices.

An in-memory computing method for computing MAC and vector-matrix multiplications includes applying an input to an array of RM devices arranged in columns and rows, where the array is arranged such that RM devices in each row of the array are interconnected by a respective wordline and RM devices in each column of the array are interconnected by a respective bitline. Each RM device in the array of RM devices has an associated threshold voltage and is configured to store a data value therein as a resistance value. The method includes computing multiplication and accumulation between an input applied to a given wordline and data values stored in the array of RM devices.

The multiply-accumulate (MAC) operation is performed by producing an output in response to the input being applied to a given wordline, comparing the output to a threshold, and incrementing a count for the bitline when the output exceeds the threshold. The count represents the digitized multiplication between the input at the given wordline and the conductance of the RM device interconnected by the given bitline and the given wordline. The cumulative count for a given bitline after all relevant wordlines have been processed represents the digitized dot-product of the input vector and the stored vector represented by values of RM devices along the given bitline.

In various implementations, the input applied to the given wordline is a voltage applied to the given wordline as a pulse, and the output of each bitline, before reaching the interface circuit, is a current value. Further, the input may be a series of pulses and a total of the series of pulses represents an input value. The method includes applying the input to each wordline sequentially. The method further includes applying the input to each wordline using a decoder.

In another aspect, the method also includes receiving the output from the given bitline at a respective comparator and comparing the output to a threshold associated with the respective comparator. The method further includes, in response to the output exceeding the threshold associated with the respective comparator, incrementing a count of a respective counter. In various implementations, each device in the array of RM devices stores at least one of a resistance value and a conductance value, and at least one of the resistance value and the conductance value is an element of a potential feature (or weight, or coefficient) vector represented in a column of the array of RM devices.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

The system design of the present disclosure overcomes the above described limitations related to RM devices and ADCs, and produces an efficient in-memory computing system, for example, a memory processing unit (MPU) that can significantly outperform current CPU and GPU computing architecture for data-intensive tasks. The approach is based on an ADC-less in-memory computing approach that can be directly performed using on-chip memory such as RRAM, MRAM, PCRAM, or SRAM, and can support both soft and precise computing tasks. The in-memory system tolerates high device variability and low ON/OFF ratios. Furthermore, the elimination of area-consuming ADCs and post processing circuitry allows the system to operate at higher speeds using smaller circuit areas compared to its analog and multilevel counterparts.

Figure 1:
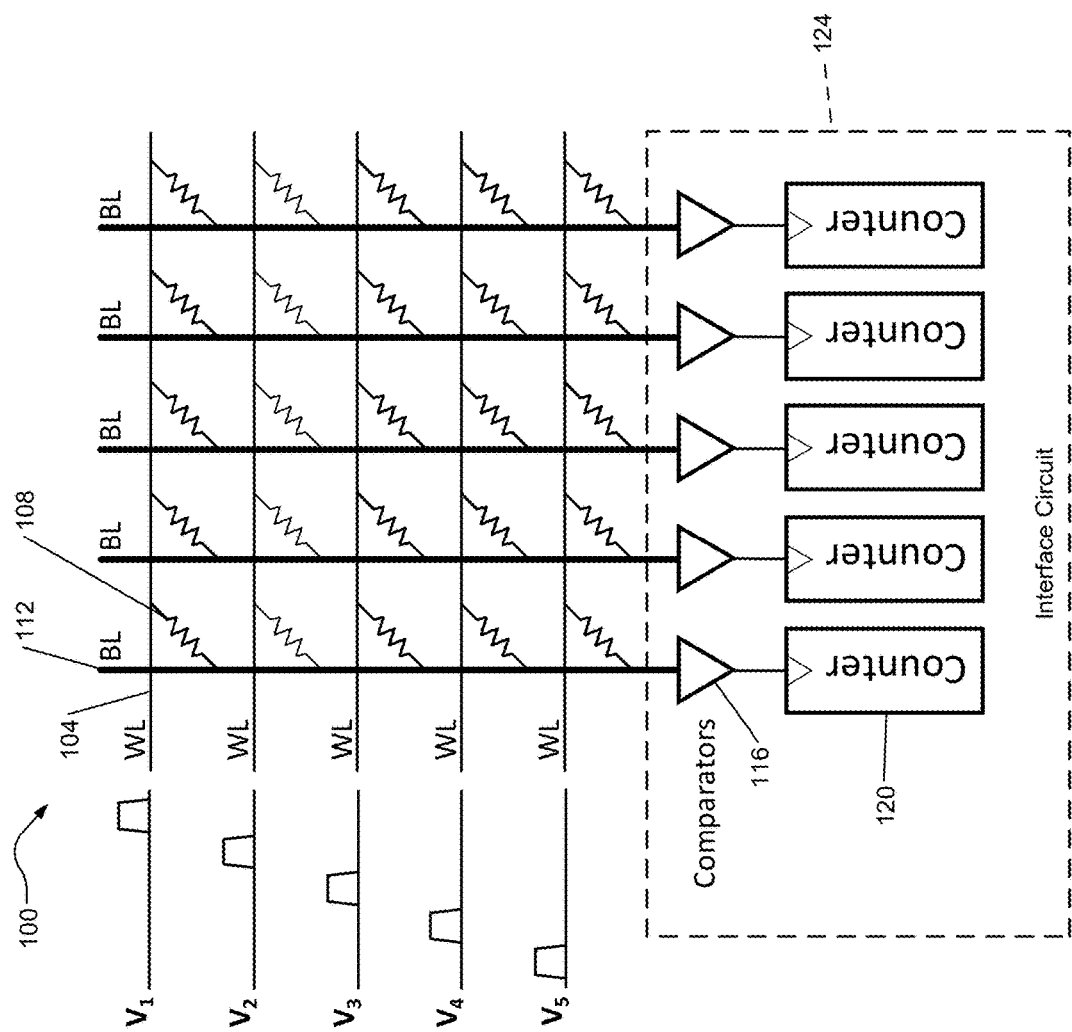
FIG. 1 is a schematic showing an in-memory computing system including an array of resistive memory (RM) devices.

A typical analog (multi-level) vector-matrix multiplication operation can be considered in two non-pipelined stages: an analog stage and an iterative sampling stage. In the first part, all relevant wordlines in an array of RM devices are activated, allowing the current to flow through the array according to the RM devices' conductance and the voltage applied at the input. In the second stage, the output currents at the bitlines are digitized using ADC circuitry, which is naturally of an iterative type such as in SAR or ramp ADCs. In the present disclosure, an in-memory computing system performing vector-matrix multiplication with an array of RM devices without the need of conventional ADCs is described. FIG. 1 is a schematic showing an in-memory computing system 100 including an array of RM devices. The array depicts five wordlines and five bitlines. Further details regarding this example hardware system may be found in U.S. patent application Ser. No. 15/723,668 filed on Oct. 3, 2017 and entitled "Field-Programmable Crossbar Array For Reconfigurable Computing," which is incorporated by reference in its entirety.

Each wordline has a corresponding input. For example, a first wordline 104 has an input voltage (V1) in the form of a pulse. At the intersection of each wordline and bitline is a RM device. For example, a first RM device 108 is at the intersection of the first wordline 104 and a first bitline 112.

As ADC are no longer coupled to the array, comparators are coupled to the output of each bitline to determine if the output of a bitline exceeds a threshold value. That is, instead of directly measuring the analog value of the output current or charge, the comparators distinguish whether the output is high or low in a binary fashion. The comparator approach relies on the threshold value and is insensitive to the exact values of the current, allowing much better device variability and ON/OFF tolerance.

The input at each wordline may be discrete in time. That is, one input pulse is being applied to one of the wordlines at any given time, although some algorithms can tolerate applying inputs to multiple wordlines simultaneously. In various implementations, an interface circuit 124 may be configured to control the application of the input to each wordline and can monitor which wordline is receiving input at any given time. A comparator is connected to each bitline. For example, a first comparator 116 is connected to the first bitline 112.

In various applications, the input value at the wordlines may be binary. The input "1" is represented by a voltage pulse, while input "0" is represented by no pulse (or pulse with 0 amplitude) at the wordline. The array wordlines may be activated sequentially or in a series manner, as shown in FIG. 1. The result is a series of current pulses at the bitline side, each of them representing an analog multiplication between the wordline voltage and the corresponding bitline device conductance, such that, $$I_{BL}^{(i)} = V_{WL}^{(j)} G^{(i,j)}$$

where $I_{BL}^{(i)}$ is the output current of bitline i, $V_{WL}^{(j)}$ is the input voltage of wordline j, $G^{(i,j)}$ is the conductance of the RM device at the intersection of bitline i and wordline j. In this case, $V_{WL}^{(j)} \in \{V_{READ}, 0\}$ and $G^{(i,j)} \in \{HRS, LRS\}$. Further, a simple comparator at the bitline side is sufficient to detect the output signal of each input pulse, where the comparator output is defined as, $$V_C^{(i)} = \begin{cases} 1, & I_{BL}^{(i)} \geq \theta \\ 0, & \text{else} \end{cases}$$

where $V_C^{(i)}$ is the binary comparator output at bitline i and θ is the comparator threshold. The comparator binary output is then fed to a counter, for example, the first counter 120, as shown in FIG. 1, where the counted number is increased by 1 or 0, based on the comparator binary output. The count represents the MAC operation performed between the input at the given wordline and the conductance of the RM device interconnected by the given bitline and the given wordline.

The next wordline is then active and the processes repeated, until all relevant wordlines have been processed. The counter output is defined as, $$D^{(i)} = \sum_{j=1}^{m} C^{(i)}$$

where $D^{(i)}$ is the counter output at bitline i and m is the number of relevant wordlines. The cumulative counted number at bitline i after all wordline inputs have been processed represents the dot-product between the input vector and the feature (for example, weight) vector represented by the conductance values of the RM devices along bitline i.

A counter is connected to each comparator. For example, a first counter 120 is connected to the first comparator 116. Each counter maintains a count of occurrences where the output current at the corresponding bitline is above the comparator threshold. For example, the first counter 120 is incremented in response to the output current of the first bitline 112 exceeding the threshold value of the first comparator 116. In various implementations, each counter and comparator is included in an interface circuit 124. For example, the interface circuit 124 may further process the dot-product of the input and RM device conductance vectors. That is, the interface circuit 124 can receive the output of each counter. In various implementations, the interface circuit 124 may also be electrically coupled to each wordline (not shown) and include a device to control the application of the input to the wordlines of the array.

In various implementations, the input applied to the array is non-binary, i.e. multi-bit or analog. When the input is non-binary, a series of voltage pulses is applied to a wordline, for example, the first wordline 104. This series of pulses applied to each wordline represents a magnitude of the input. Additionally, as mentioned above, the input applied to each wordline may be discrete in time. That is, each input pulse of a wordline is non-overlapping with input pulses of a separate wordline. The pulses applied to each wordline are applied in a predetermined order, for example, in a sequential order and controlled by the decoder in the interface circuit. In various implementations, the pulses may be used to represent multi-bit inputs or sequential inputs.

Figure 4C:
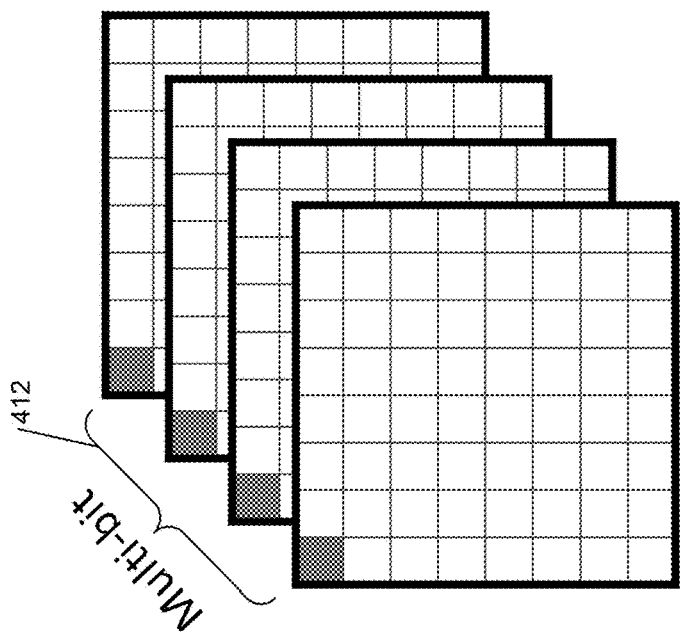
FIG. 4C is a schematic depicting a multi-bit value represented by multiple arrays of RM devices.
Figure 4B:
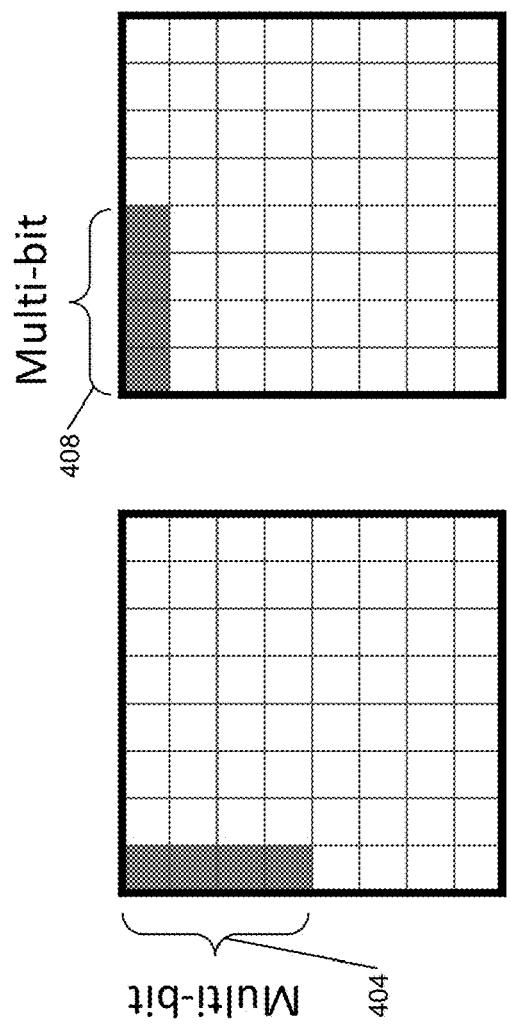
FIG. 4B is a schematic depicting a multi-bit value represented by multiple RM devices in the same wordline.
Figure 4A:
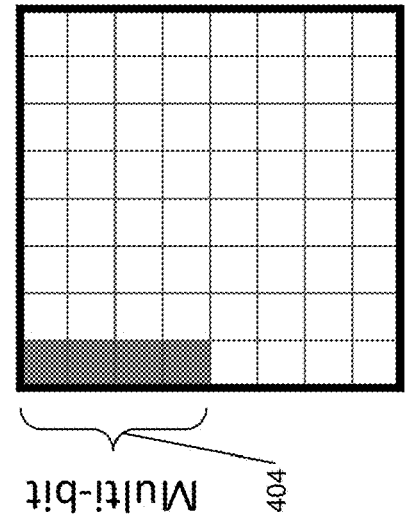
FIG. 4A is a schematic depicting a multi-bit value represented by multiple RM devices in the same bitline.

The above implementation considers each RM device as binary, e.g. the device conductance is at either HRS or LRS. In various implementations, non-binary, i.e. multi-bit data may need to be used. The multi-bit data can be represented using multiple binary RM devices within the same bitline, or multiple binary RM devices within the same wordline, as shown in FIGS. 4A and 4B. Also, multi-bit data can be represented over multiple RM arrays, as shown in FIG. 4C.

The input applied to the array may represent a pixel of an image. For example, each input can represent the intensity of the pixel of the image. Additionally, each RM device stores a data value. For example, each data value in the array of RM devices stores a resistance, a conductance, or both. Further, the stored resistance or the stored conductance represents an element of a potential feature represented in the respective column of the array. That is, the array can receive the input and compare the input to a stored potential feature represented in the column, for example, the first bitline 112. Therefore, the output at the first bitline 112 can indicate a similarity between the input of the first wordline 104 and the first RM device 108, and the first RM device 108 is an element of the potential feature represented in the first bitline 112. Then, the first comparator 116 determines whether the output of the first bitline 112 is greater than the threshold associated with the first comparator 116. As mentioned previously, when the threshold is exceeded for each comparator the count of the respective counter, in this case the first counter 120, is incremented, performing the digitized multiply-accumulate (MAC) operation performed between the input and the conductance of the RM device.

In various implementations, the interface circuit 124 may include a display device (not shown) to display the count to an operator. Further, the interface circuit 124 may perform additional processing on the received count, that is, the dot-product of the input and conductance vector of the respective RM device.

Figure 2:
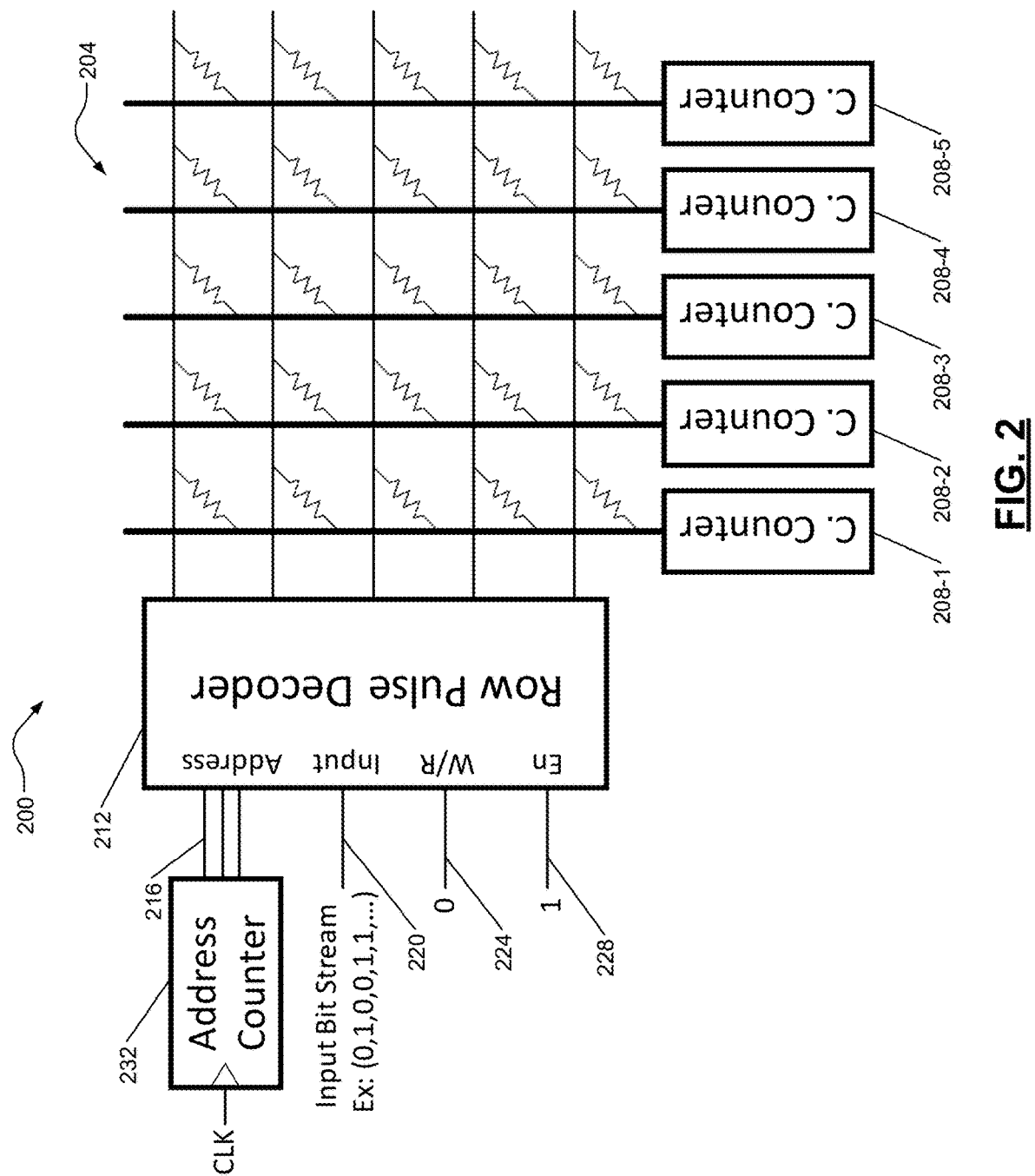
FIG. 2 is a schematic showing example interface circuitry electrically coupled to an array of RM devices.

FIG. 2 is a schematic showing example interface circuitry 200 electrically coupled to an array of RM devices. The example interface circuitry 200 excludes an ADC. As mentioned above, to compute a dot-product without using an ADC, input in the form of pulses are applied to each wordline of a matrix 204. The interface circuitry 200 may include a plurality of column counters 208-1 through 208-5. The column counters 208-1 through 208-5 count the output pulses at the respective bitline that exceed the respective threshold. In various implementations, the interface circuitry 200 also includes a decoder 212. The decoder 212, shown as a Row Pulse Decoder (RPD), is used to activate the wordlines in a sequential order. The decoder receives the address of the desired wordline through address pins 216 and the input to apply through an input pin 220. The decoder 212 activates a corresponding wordline if a ONE is applied to decoder input through the input pin 220. For example, voltage is applied to the activated wordline and is either V_READ or V_WRITE depending on the state of a W/R pin 224. The decoder 212 can also be disabled using an enable (En) pin 228. For a typical dot-product operation, the decoder address is fed through an address counter 232, where the address counter 232 simply loops on the addresses of the wordlines.

Figure 3B:
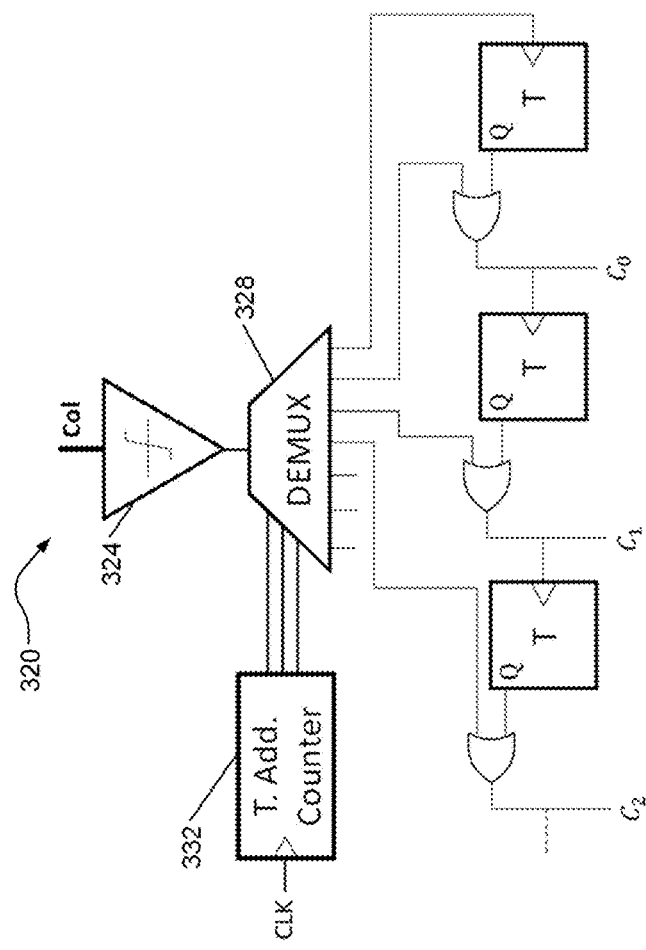
FIG. 3B is a schematic depicting a multi-bit column counter electrically coupled to an array of RM devices.
Figure 3A:
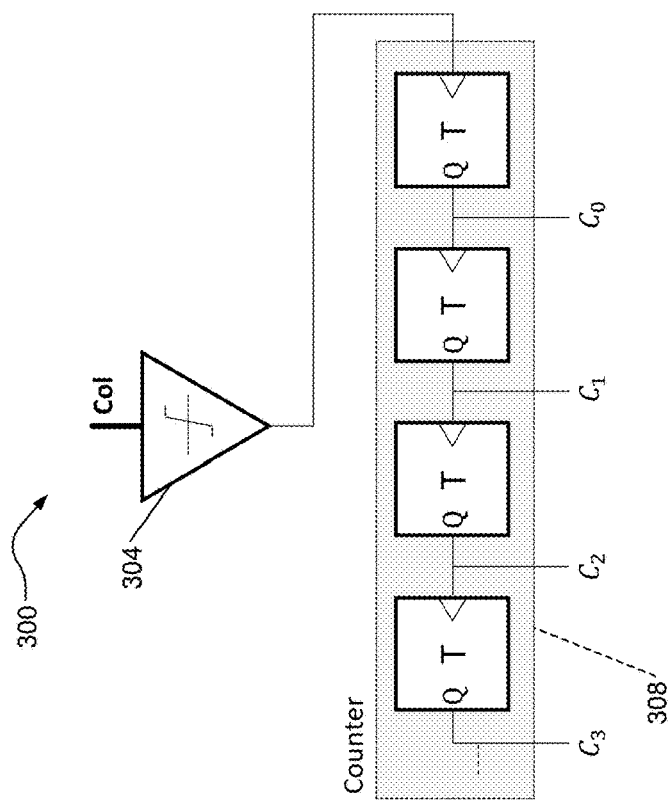
FIG. 3A is a schematic showing implementation of a column counter electrically coupled to an array of RM devices.

FIG. 3A is a schematic showing implementation of a column counter 300 electrically coupled to an array of RM devices. As described with respect to FIG. 2, each bitline is connected to a column counter, for example, the column counter 300 of FIG. 3A. The column counter 300 in this example includes a comparator 304 and an asynchronous ripple counter 308. The asynchronous counter is useful for single-bit number representation, or multi-bit number sored over multiple columns (bitlines) or arrays.

FIG. 3B is a schematic depicting an example of a multi-bit column counter 320 electrically coupled to an array of RM devices. In various implementations, an output of a comparator 324 of each bitline is directed to the corresponding counter bit to increment through a DEMUX 328. The select line of the DEMUX is supplied through a truncated address counter 332. The truncated address counter 332 is the lower significant bits of the wordline address counter (FIG. 2). For instance, a 64×64 array uses a 6-bit address counter, and in the case of adopting 8-bit words, only lower three bits of the address counter are directed to the DEMUX select lines. Hence, the dot-product is performed over the 64-bit bitlines, while each successive 8-bits are considered a word with bit-location weights. In one example, the multi-bit column counter determines a count and considers the bit location within the word while counting. For instance, an activated lowest significant bit (LSB) should increase the count by one, while the second LSB should increase the count by two. Thus, each word's bit should increase a corresponding bit in the column counter. This counter is useful for multi-bit number sored over multiple rows (wordlines).

Referring to FIG. 4A, a schematic depicting a first multi-bit value 404 represented by multiple RM devices in the same bitline is shown. The first multi-bit value 404 is represented by multiple RM devices across multiple wordlines but in the same bitline.

In various implementations, a second multi-bit value 408 represented by multiple RM devices in the same wordline, as depicted in FIG. 4B. The second multi-bit value 408 spans across multiple bitlines and remains in the same wordline.

Referring now to FIG. 4C, a schematic depicting a third multi-bit value 412 represented by multiple arrays of RM devices is shown. That is, the third multi-bit value 412 spans across multiple arrays and remains at the same location of each array.

Figure 5B:
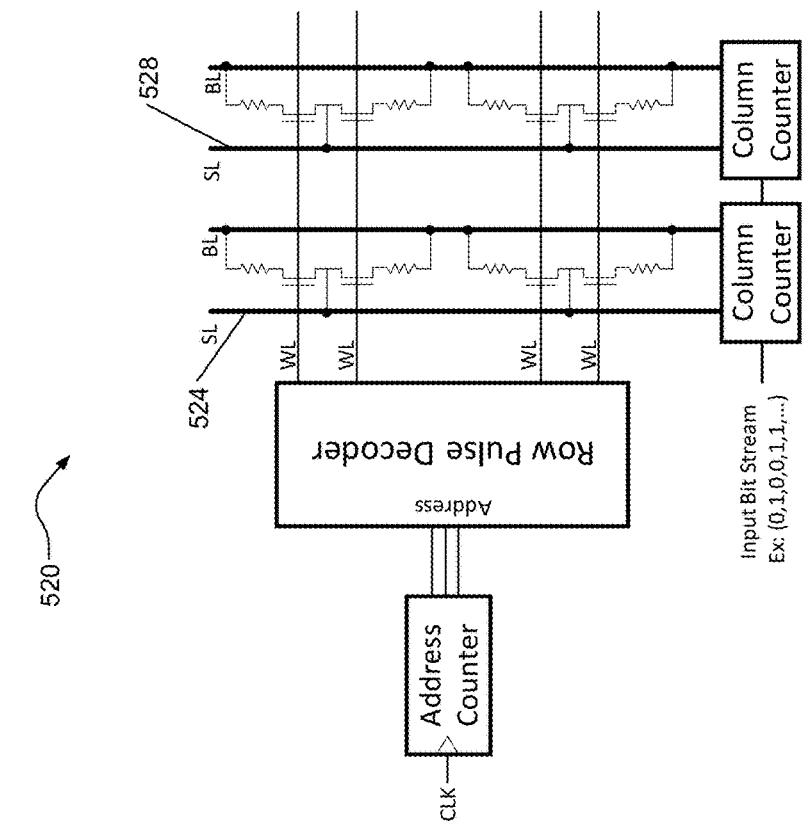
FIG. 5B is a schematic depicting a transistor-gated RM array including a second type of source lines for an ADC-less MAC and matrix multiplication operations.
Figure 5A:
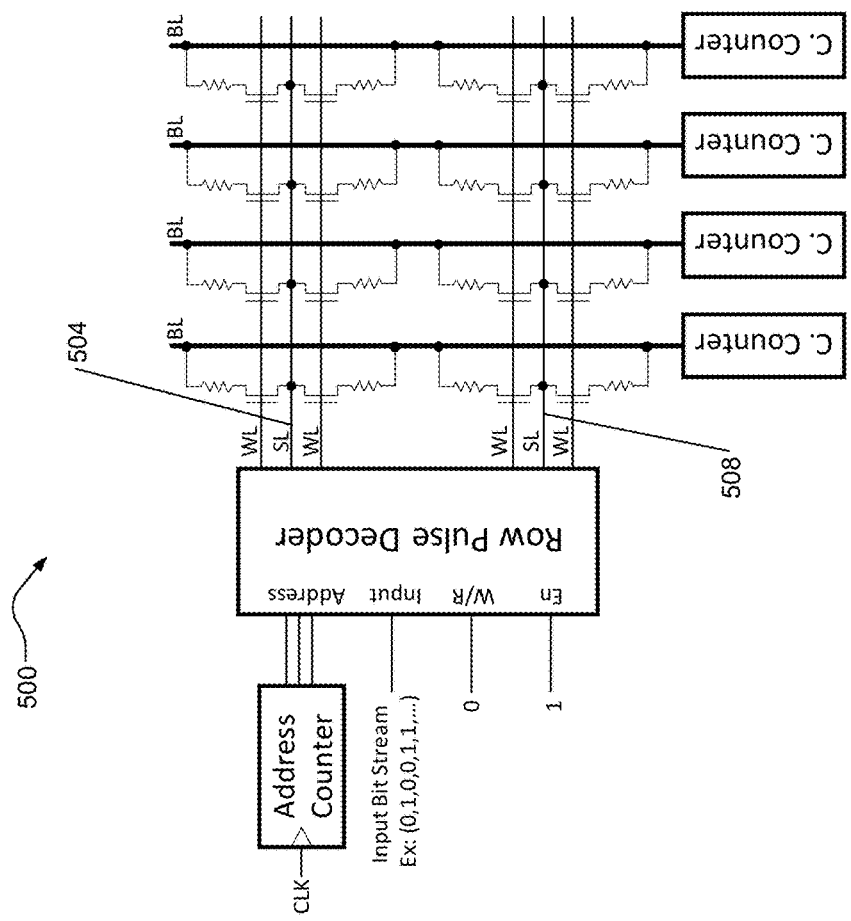
FIG. 5A is a schematic depicting a transistor-gated RM array including a first type of source lines for an ADC-less MAC and matrix multiplication operations.

FIG. 5A is a schematic depicting a transistor-gated RM array 500 including a first type of source lines for an ADC-less vector-matrix multiplication operation. Transistor gating allows better control and power-management of the RM arrays at the expense of the system area. In a transistor-gated array implementation, a third line, for example, a source line is included in the array along with the wordlines and the bitlines. For example, a first source line 504 and a second source line 508 are shown in FIG. 5A. The source lines are used to the supply the source voltage to the gate transistor and can be supplied through the wordline or bitline directions. In the first case, the gated array 500 is interfaced in the same technique described for the passive crossbars, and the source lines are parallel to the wordlines. However, the RPD needs to supply the input as the source line voltage, while the wordline is used to activate the desired row transistors.

FIG. 5B is a schematic depicting a transistor-gated RM array 520 including a second type of source lines for an ADC-less vector-matrix multiplication operation. In various implementations of the second type of source lines, the direction of a first source line 524 and a second source line 528 is parallel to the bitlines. A modified column counter is implemented to supply the input stream to the source lines when the second type of source line is used.

Figure 6:
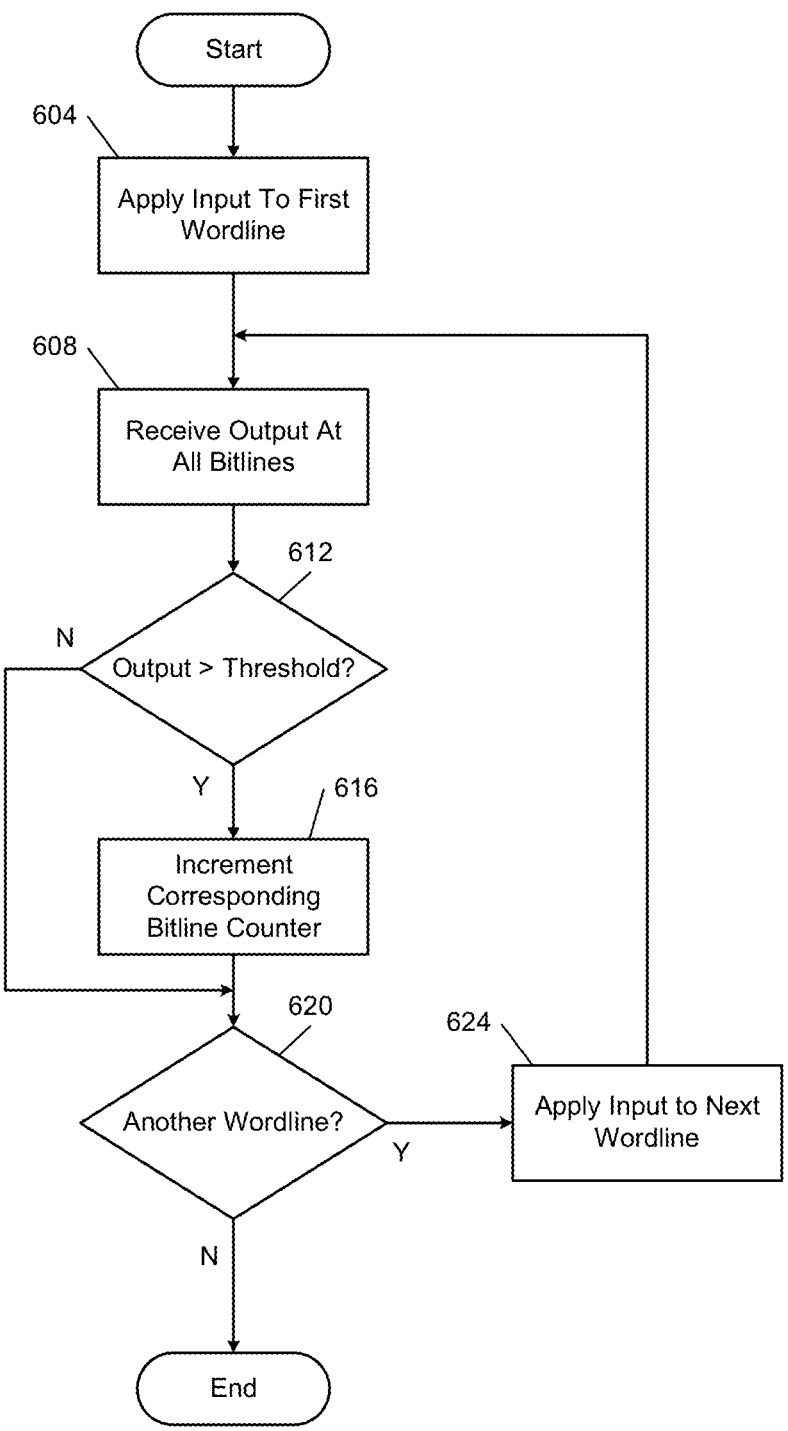
FIG. 6 is a flowchart depicting a computation of a vector-matrix multiplication process controlled by an interface circuit electrically coupled to an array of RM devices.

FIG. 6 is an example flowchart depicting a computation of vector-matrix multiplication controlled by an interface circuit electrically coupled to an array of RM devices. Control begins at 604 where the interface circuit applies input to a first wordline of the array of RM devices. As described previously, the input may be a voltage applied to the array. As shown in FIG. 1, the input is applied sequentially to the wordlines of the array, and the input is a pulse waveform. Control continues to 608 where the interface circuit receives the output from all bitlines.

Control proceeds to 612 where comparator attached to a selected bitline compares the output to a respective threshold of the comparator. In response to the output of the selected bitline exceeding the threshold of the comparator, control continues to 616 increment a counter coupled to the comparator of the corresponding bitline. Otherwise, if the output of the selected bitline does not exceed the threshold, control proceeds to 620. Operations on all bitlines can be performed in parallel by control in steps 612-620. Afterwards, control determines if the input includes another wordline. If control determines that the input includes another wordline, control proceeds to 624 where the input is applied to the next wordline. Then, control returns to 608 to determine the output of the bitlines. Otherwise, if control determines that there is not another wordline at 620, control ends. As the interface circuit includes each counter of the array of resistive devices, the interface circuit can store and maintain data regarding the dot-product of the input vector and the vector represented by each bitline.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An in-memory computing system for performing multiple-accumulate (MAC) operations and computing vector-matrix multiplications, the in-memory computing system comprising:
an array of resistive memory devices arranged in columns and rows, such that resistive memory devices in each row of the array are interconnected by a respective wordline and resistive memory devices in each column of the array are interconnected by a respective bitline, each resistive memory device in the array of resistive memory devices has an associated threshold voltage and is configured to store a data value therein as a resistance value; and
an interface circuit electrically coupled to each bitline of the array of resistive memory devices and cooperatively operates with the array of resistive memory devices to compute a vector-matrix multiplication between data values of a first vector as inputs applied to a set of wordlines and data values of a second vector stored in the array of resistive memory devices;
a plurality of comparators, wherein each comparator of the plurality of comparators is directly connected to a corresponding bitline, and wherein a respective comparator:
receives outputs on the given bitline in response to the inputs being applied to the set of wordlines; and
compares the outputs from the given bitline to a threshold associated with the respective comparator; and
a plurality of counters, wherein each counter of the plurality of counters is directly connected to a corresponding comparator of the plurality of comparators, and wherein each counter increments a count maintained for the given bitline when the comparison of the output for the given bitline exceeds the threshold associated with the respective comparator, such that the count for the given bitline represents the MAC operation performed between the data values of the first vector as inputs applied to the set of wordlines and the second vector stored in the array of resistive memory devices.

2. The in-memory computing system of claim 1 wherein a given input applied to a given wordline is a voltage applied to the given wordline as a pulse, and wherein the output on the given bitline is a current value.

3. The in-memory computing system of claim 2 wherein the given input is a series of pulses, and wherein a total of the series of pulses represents a non-binary value.

4. The in-memory computing system of claim 1 wherein the inputs are applied to the set of wordlines sequentially.

5. The in-memory computing system of claim 1 further comprising a decoder electrically coupled to each wordline, wherein the decoder is configured to apply the inputs to the set of wordlines.

6. The in-memory computing system of claim 1 wherein the second vector stored in the array of resistive memory devices comprises a feature vector.

7. The in-memory computing system of claim 1 wherein multiple resistive memory devices store multi-bit values in an identified bitline in the array of resistive memory devices.

8. The in-memory computing system of claim 1 wherein multiple arrays of resistive memory devices store multi-bit values.

9. An in-memory computing method for performing multiply-accumulate (MAC) operations and computing vector-matrix multiplications, the method comprising:
applying data values of a first vector as inputs to a set of wordlines of an array of resistive memory devices arranged in columns and rows, wherein the array is arranged such that resistive memory devices in each row of the array are interconnected by a respective wordline and resistive memory devices in each column of the array are interconnected by a respective bitline, and wherein each resistive memory device in the array of resistive memory devices has an associated threshold voltage and is configured to store a data value therein;
computing vector-matrix multiplication between the data values of the first vector applied as inputs to the given set of wordlines and the data values of a second vector stored in the array of resistive memory devices by, for each given bitline:
receiving, by a comparator directly connected to a corresponding bitline, outputs on the given bitline in response to the inputs being applied to the set of wordlines;
comparing, by the comparator directly connected to the corresponding bitline, the outputs from the given bitline to a threshold associated with the respective comparator; and
incrementing, by a counter directly connected to a corresponding comparator, a count for the given bitline when the comparison of the output for the given bitline exceeds the threshold, such that the count of the given bitline performs the MAC operation between the data values of the first vector as inputs applied to the set of wordlines and the second vector stored in the array of resistive memory devices.

10. The in-memory computing method of claim 9 wherein a given input applied to a given wordline is a voltage pulse, and wherein the output on the given bitline is a current value.

11. The in-memory computing method of claim 10 wherein the given input is a series of pulses, and wherein a total of series of pulses represents a non-binary value.

12. The in-memory computing method of claim 9 further comprising applying the inputs to the set of wordlines sequentially.

13. The in-memory computing method of claim 9 further comprising applying the inputs to the set of wordlines using a decoder.

14. The in-memory computing method of claim 9 wherein each device in the array of resistive memory devices stores the data values of the second vector as at least one of a resistance value and a conductance value.

15. An in-memory computing system for performing multiple-accumulate (MAC) operations and computing vector-matrix multiplications, the in-memory computing system comprising:
an array of resistive memory devices arranged in columns and rows, such that resistive memory devices in each row of the array are interconnected by a respective wordline and resistive memory devices in each column of the array are interconnected by a respective bitline, each resistive memory device in the array of resistive memory devices has an associated threshold voltage and is configured to store a data value therein as a resistance value; and
an interface circuit electrically coupled to each bitline of the array of resistive memory devices and cooperatively operates with the array of resistive memory devices to compute a vector-matrix multiplication between data values of a first vector as inputs applied to a set of wordlines and data values of a second vector stored in the array of resistive memory devices, where the interface circuit, for each given bitline:

receives outputs on the given bitline in response to the inputs being applied to the set of wordlines; and compares the outputs from the given bitline to a threshold; and wherein the interface circuit comprises a plurality of counters, wherein each counter of the plurality of counters is electrically connected to a corresponding bitline, and wherein each counter increments a count maintained for the given bitline when the comparison of the output for the given bitline exceeds the threshold, such that the count for the given bitline represents the MAC operation performed between the data values of the first vector as inputs applied to the set of wordlines and the second vector stored in the array of resistive memory devices.

16. The in-memory computing system of claim 15 wherein the given input is a series of pulses, and wherein a total of the series of pulses represents a non-binary value.

17. The in-memory computing system of claim 15 wherein the inputs are applied to the set of wordlines sequentially.

18. The in-memory computing system of claim 15 further comprising a decoder electrically coupled to each wordline, wherein the decoder is configured to apply the inputs to the set of wordlines.

19. The in-memory computing system of claim 15 wherein the second vector stored in the array of resistive memory devices comprises a feature vector.

20. The in-memory computing system of claim 15 wherein multiple resistive memory devices store multi-bit values in an identified bitline in the array of resistive memory devices.

* * * * *